United States Patent [19]
Kochi

[11] Patent Number: 5,847,669
[45] Date of Patent: Dec. 8, 1998

[54] SEMICONDUCTOR DEVICE AND SIGNAL PROCESSING SYSTEM USING THE SAME

[75] Inventor: Tetsunobu Kochi, Hiratsuka-shi, Japan

[73] Assignee: Canon Kabushiki Kaisha, Tokyo, Japan

[21] Appl. No.: 701,752

[22] Filed: Aug. 22, 1996

[30] Foreign Application Priority Data

Aug. 23, 1995 [JP] Japan .................................. 7-214562

[51] Int. Cl.⁶ .................................................. H03M 1/12
[52] U.S. Cl. .......................... 341/172; 341/141; 341/155; 341/161; 341/158
[58] Field of Search .................................... 341/172, 141, 341/161, 155, 158

[56] References Cited

U.S. PATENT DOCUMENTS

| | | | |
|---|---|---|---|
| 4,326,192 | 4/1982 | Merrill et al. | 340/347 AD |
| 4,415,881 | 11/1983 | Lechner et al. | 340/347 AD |
| 5,117,131 | 5/1992 | Ochi et al. | 307/448 |
| 5,281,871 | 1/1994 | Mori et al. | 307/454 |
| 5,428,237 | 6/1995 | Yuzurihara et al. | 257/349 |

*Primary Examiner*—Brian K. Young
*Assistant Examiner*—Jason L. W. Kost
*Attorney, Agent, or Firm*—Fitzpatrick, Cella, Harper & Scinto

[57] ABSTRACT

In a semiconductor device, one ends of capacitors connected via switching elements to multiple-input terminals, the other ends of the capacitors being connected in common to an input terminal of a sense amplifier. A first power source is provided for supplying a power to the switching elements, and a second power source is provided for supplying a power to the sense amplifier. The first and second power sources are independent and separate.

33 Claims, 16 Drawing Sheets

| INPUT | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

FIG. 14

| ANALOG INPUT SIGNAL VOLTAGE | S3 | S2 | S1 |
|---|---|---|---|
| $0.0 \leq VA < 0.625$ | 0 | 0 | 0 |
| $0.625 \leq VA < 1.25$ | 0 | 0 | 1 |
| $1.25 \leq VA < 1.875$ | 0 | 1 | 0 |
| $1.875 \leq VA < 2.5$ | 0 | 1 | 1 |
| $2.5 \leq VA < 3.125$ | 1 | 0 | 0 |
| $3.125 \leq VA < 3.75$ | 1 | 0 | 1 |
| $3.75 \leq VA < 4.375$ | 1 | 1 | 0 |
| $4.375 \leq VA < 5.0$ | 1 | 1 | 1 |

SEMICONDUCTOR DEVICE AND SIGNAL PROCESSING SYSTEM USING THE SAME

BACKGROUND OF THE INVENTION

1. Field of the Invention

The present invention relates to devices such as a semiconductor device for performing parallel arithmetic operations, a correlation calculation device, a D/A converter, and an A/D converter, and a signal processing system using such devices.

2. Related Background Art

As signal processing is becoming increasingly sophisticated, it is important to realize an arithmetic unit of low cost which processes a great amount of data at high speed. Of the devices constituting such an arithmetic unit, a correlation unit used for detecting motion (e.g., from one frame to another of a moving image), high precision analog/digital and digital/analog converters, and the like are required to process multiple-input signals at high speed, on the order of gigaHz. This requirement also applies to technologies such as spread spectrum (SS) communications.

In order to realize such a signal processing circuit by a semiconductor integrated circuit, it is necessary for high speed signal processing to perform parallel arithmetic operations by using a plurality of semiconductor chips and to use circuits of a large scale, even with the latest fine patterning rules. For this reason, large scale integrated semiconductor devices with multiple-input terminals have been used for dealing with high speed processing.

In a semiconductor device for performing parallel arithmetic operations, as the number of signals to be parallel-processed increases, the circuit scale becomes large like a geometric series, manufacturing cost increases, and manufacturing yield falls. As the circuit scale becomes larger, the arithmetic operation speed lowers, and the consumption of power increases considerably because in the an increase in delay time of wiring or the like and because of an increase in the sheer number of arithmetic operations.

For example, in a solid state image pickup device shown in FIG. 17, image pickup elements 41 disposed in a matrix shape at high density constitute a sensing unit 60 as an area sensor. A time sequential analog signal picked up by the sensing unit 60 is converted by an A/D converter 40 into a digital signal which is temporarily stored in a frame memory 39. The digital signals read from the memory 39 are processed by an arithmetic operation circuit 38 and output from an arithmetic operation output circuit 50. With this device, a process of detecting a motion amount ($\Delta X$, $\Delta Y$) of an image can be performed through correlation calculations between data signals at different times.

In order to realize real time processing of a moving image with high fidelity, the number of arithmetic operations becomes very large and the circuit scale expands like a geometrical series, thereby lowering the processing speed. For example, a device capable of processing moving images in the MPEG 2 scheme proposed as the compression and expansion method of moving images, is still under development. The problems of parallel arithmetic operations therefore include a problem of lowered arithmetic operation speed caused by a large circuit scale and a problem of an increase in consumption of power, as well as an increased manufacturing cost and a lowered manufacturing yield.

A majority decision arithmetic circuit useful for an arithmetic operation circuit is described in "Economical Majority Decision Logic IC Realized by CMOS", Nikkei Electronics, Nov. 5, 1973, pp. 132 to 144. This article discloses a majority decision logic circuit realized by CMOSs as one of digital signal processing circuits. Also in this case, the number of CMOS elements increases and the number of arithmetic operation stages increases. Therefore, the circuit scale becomes large, the consumption of power increases, and the arithmetic operation speed lowers.

SUMMARY OF THE INVENTION

It is an object of the present invention to solve the above conventional problems and provide a semiconductor device capable of reducing a circuit scale, improving an arithmetic operation speed, and reducing a consumption power, and a semiconductor circuit, a correlation calculation unit, an A/D converter, a D/A converter, and a signal processing system, respectively using such a semiconductor device.

In order to solve the above problems, the invention provides a semiconductor device wherein one ends of capacitor means connected via switching means to multiple-input terminals, the other ends of the capacitor means being connected in common to an input terminal of a sense amplifier, comprising first power source means for supplying a power to the switching means, and second power source means for supplying a power to the sense amplifier, wherein the first and second power source means are independent and separate. With this configuration, the circuit scale can be reduced, an arithmetic operation speed can be made high, an arithmetic operation precision can be improved, and a consumption power can be reduced.

BRIEF DESCRIPTION OF THE DRAWINGS

FIG. 14 is a table illustrating the operation of the embodiment shown in FIG. 13.

DETAILED DESCRIPTION OF THE PREFERRED EMBODIMENTS

Embodiments of the invention will be described in detail with reference to the accompanying drawings.

[First Embodiment]

Figure 1:
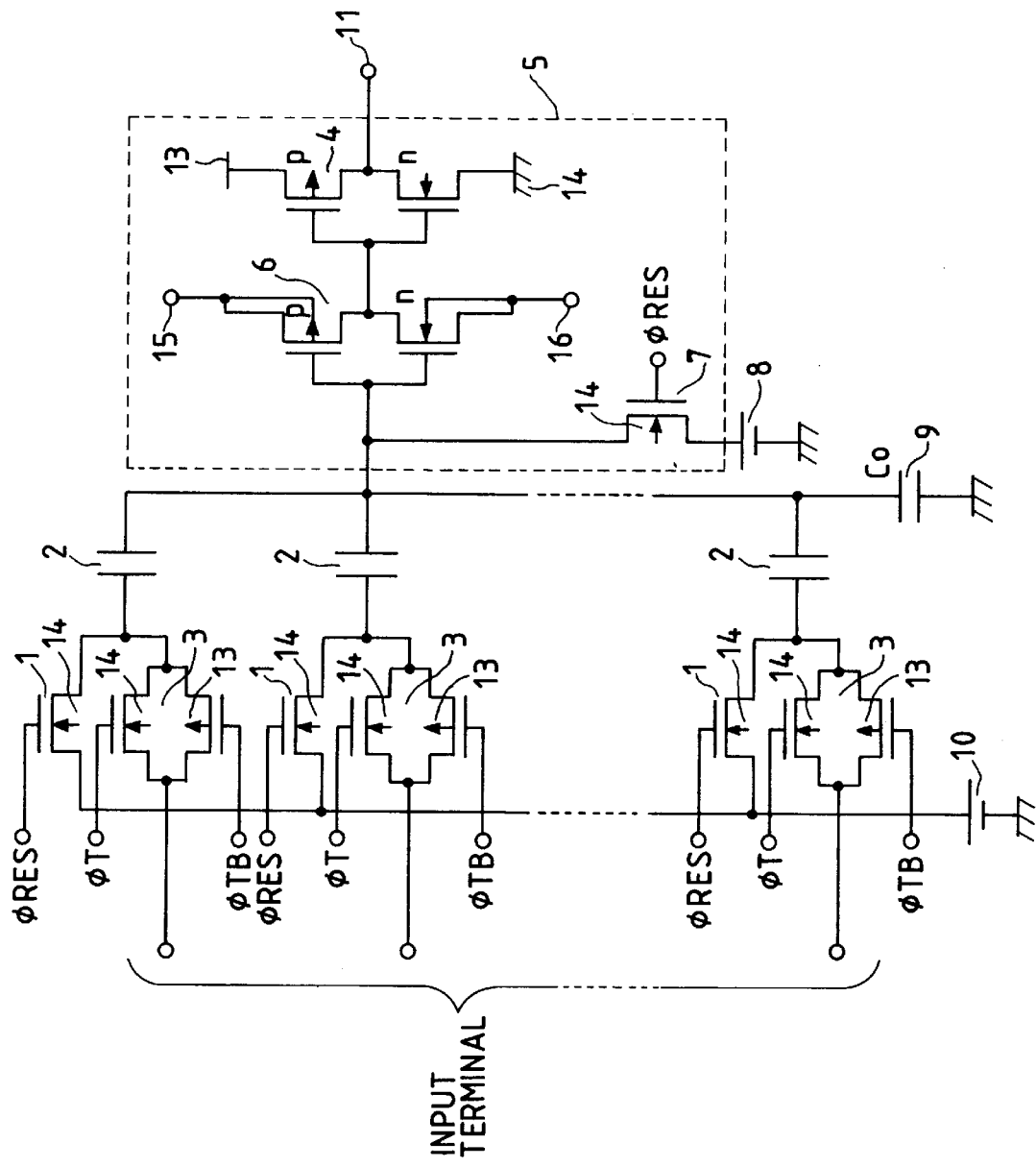
FIG. 1 is a circuit diagram showing the structure of a semiconductor device according to a first embodiment of the invention.

FIG. 1 is a circuit diagram of a semiconductor device according to an embodiment of the invention. In FIG. 1, reference numeral 1 represents an nMOS reset switch provided when necessary, reference numeral 2 represents a capacitor as capacitor means, reference numeral 3 represents a signal transfer switch made of nMOS and pMOS as switching means, reference numeral 5 represents a sense amplifier, reference numeral 6 represents a first inverter of the sense amplifier, reference numeral 4 represents a second inverter of the sense amplifier, reference numeral 7 represents a second reset switch for resetting the input terminal of the first inverter 6, reference numeral 8 represents a second reset power source for the second reset switch, reference numeral 9 represents a parasitic capacitance at one end of the capacitors 2 on the common connection side, reference numeral 10 represents a first reset power source, and reference numeral 11 represents an output terminal of the sense amplifier 5. The first and second reset switches 1 and 7, the well terminal of the signal transfer switch 3, and the well and source terminals of the inverter 4 are connected to a first power source terminal 13 or ground terminal 14. The well terminal of the first inverter 6 is connected to a second power source terminal 15, the source terminal thereof being connected to a third power source terminal 16. The second power source has a lower potential than the first power source, and the third power source has a low potential higher than the ground potential.

Figure 2:
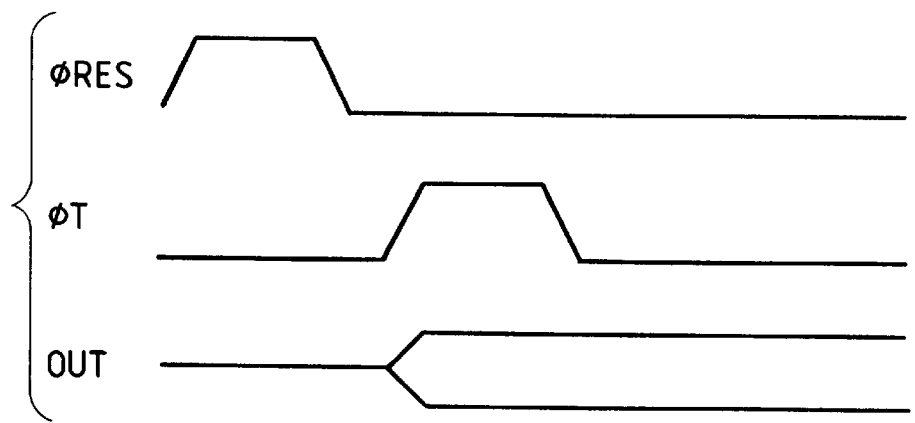
FIG. 2 is a timing chart illustrating the operation of the first embodiment.

FIG. 2 is a timing chart illustrating the operation of the semi conductor device shown in FIG. 1. In operation, the input side of the capacitor 2 is reset by a reset pulse φRES. The first reset voltage 10 is, for example, 2.5 V which is half the power source voltage of 5 V. The reset voltage is not limited to that value, but another voltage may be used. A plurality of voltages may be used. Generally, at the same time the input terminal of the inverter 6 of the sense amplifier 5 is reset to the second reset voltage, by turning on the second reset switch 7, the second reset voltage is selected to have approximately a logical inversion voltage which can invert an output of the inverter 6. Next, the reset pulse φRES is turned off so that the capacitor 2 is applied with a reset potential.

Next, as the transfer switch 3 is turned on by a transfer pulse φT, a signal is transferred from the input terminal to one end of the capacitor 2. The potential at the one end of the capacitor 2 changes, for example, from 2.5 V to VX. It is assumed here that the capacitance of the capacitor 2 is C, the capacitance of the parasitic capacitor is Co, and N capacitors 2 are connected in parallel. The other ends of the capacitors 2 connected in common change from the reset potential of the inverter 6 by the following amount corresponding to capacitor division per one input:

$$|[(2.5-VX) \times C]/(N \times c + Co)| \quad (1)$$

As the input terminal voltage of the inverter 6 changes from near the logical inversion voltage, the output terminal voltage of the inverter 6 inverts. As N signals are input, a sum of N capacitor division voltages is input to the input terminal of the inverter 6. If the sum of N voltages is positive, the input terminal of the inverter 6 shifts from the logical inversion voltage to a higher potential so that a signal "H" (high level) is output from the output terminal 11 of the sense amplifier 5, whereas if negative, a signal "L" (low level) is output. In the semiconductor device of this embodiment, each signal is weighted in accordance with a process to be executed, by selecting the amplitude of an input signal and the capacitance of the capacitor 2. Each input signal is processed by the sense amplifier 5 in the manner of parallel arithmetic operations.

Figure 3:
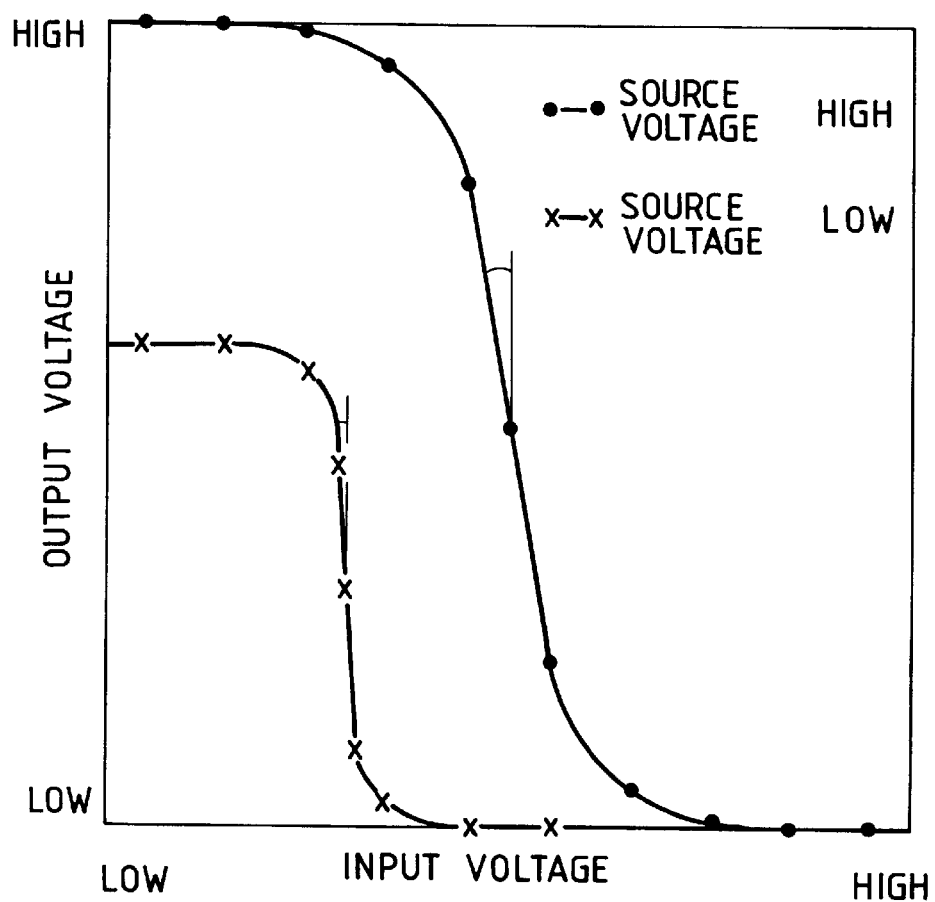
FIG. 3 is a diagram showing the input/output characteristics of a first inverter used for each embodiment of the invention.
Figure 4:
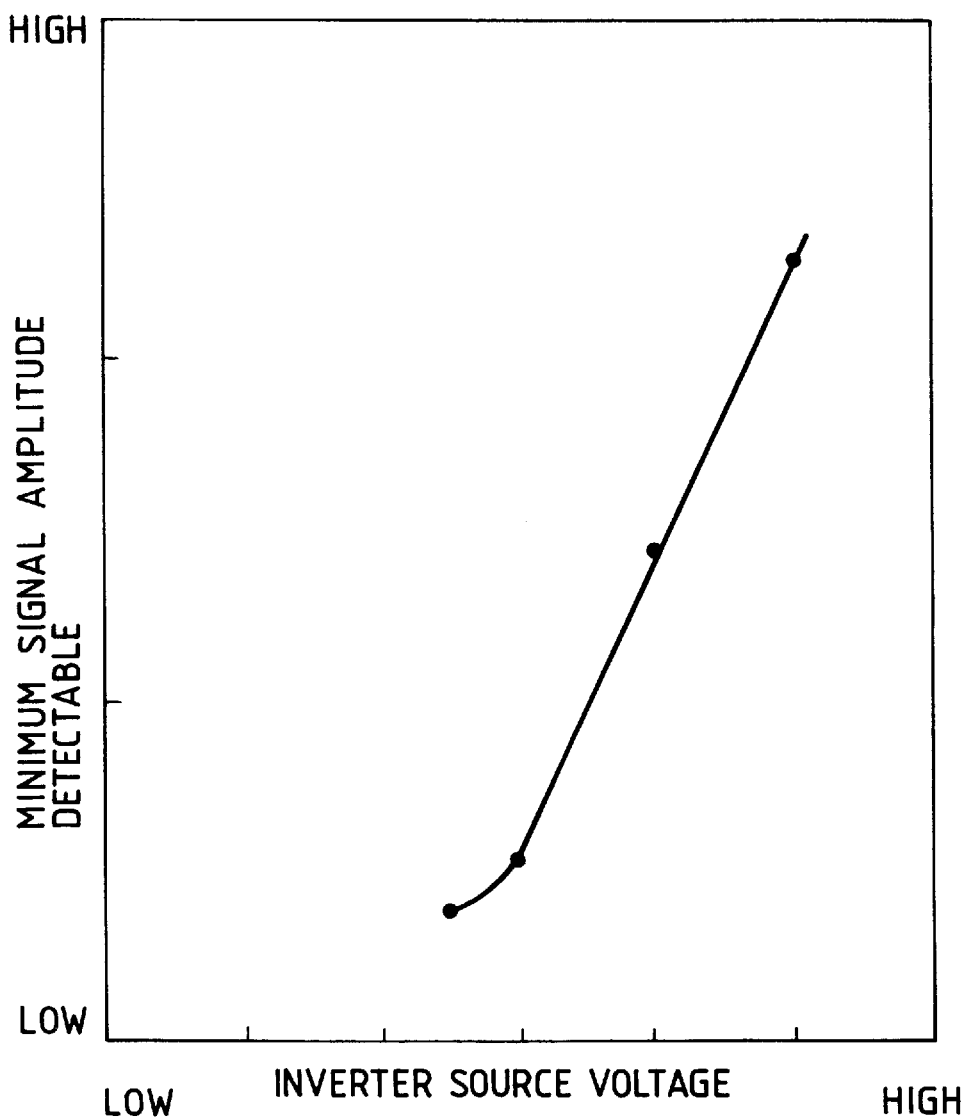
FIG. 4 is a diagram showing the characteristics of a detectable minimum signal amplitude relative to a source voltage of the first inverter according to an embodiment of the invention.
Figure 5:
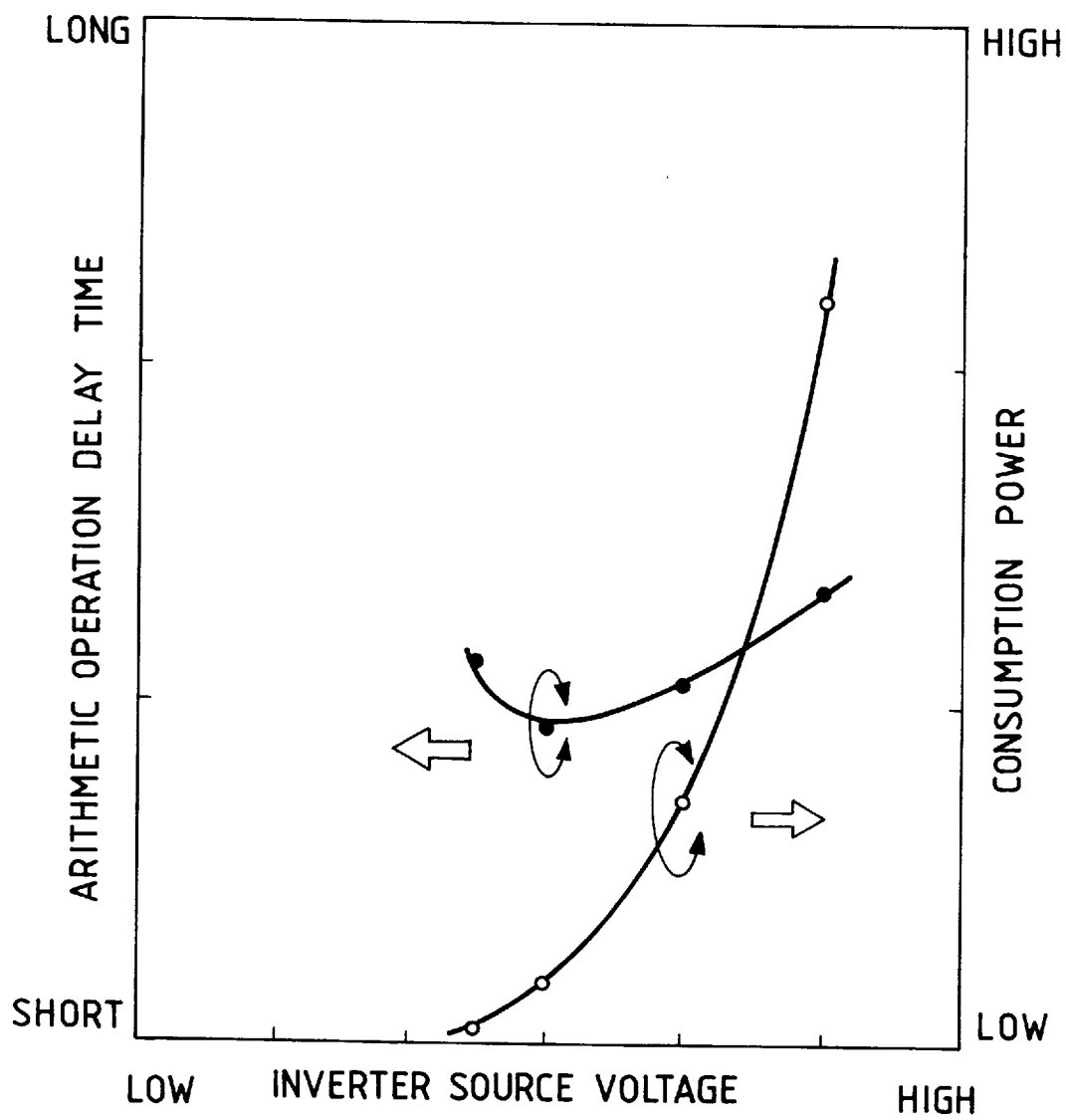
FIG. 5 is a diagram showing the characteristics of an arithmetic operation delay time and a consumption power relative to a source voltage of the first inverter according to an embodiment of the invention.

FIG. 3 shows the input/output static characteristics of the inverter 6. As shown, it has been found that the lower the power source voltage within the range allowing the inverter 6 to perform the normal operation, the greater the output voltage changes with a change in an input voltage. FIG. 4 shows the dependency of a detectable minimum signal voltage upon the power source voltage of the inverter 6. Since the input/output characteristics of the inverter 6 become sharp as the power source voltage of the inverter 6 is lowered, a smaller signal can be detected. FIG. 5 shows the dependency of an arithmetic operation delay time and of consumption of power upon the power source voltage. As seen from FIG. 5, even if the power source voltage is lowered, the arithmetic operation speed does not lower and the consumption power lowers considerably.

As above, as the power source voltage is lowered, the inverter 6 of the sense amplifier 5 can operate with high precision at a lower consumption of power. As understood from the above equation (1), it is clear that the larger the amplitude of the signal input to the capacitor 2, the potential change at the common connection point becomes larger and the arithmetic operation precision becomes better. In this embodiment, the signal input side of the first reset switch 1 and the well terminal of the transfer switch 3 are supplied with the first high power source voltage, and the well and source terminals of the inverter 6 are supplied with the second and third low power source voltages. Therefore, a large amplitude signal can be input and the operation conditions of the inverter 6 can be set independently of the input signal, so as to obtain the highest precision and lowest consumption power. As shown in FIG. 1, even if the number of input signals is increased, the circuit scale changes less in correspondence with the increased input signals. Therefore, the circuit scale can be reduced considerably as compared to a conventional parallel arithmetic operation circuit, and the manufacturing yield can be improved. Furthermore, as the circuit scale is reduced and the arithmetic operation speed is improved, more than the conventional circuit, the consumption of power is reduced further.

In the above embodiment, in order to change the output of the inverter 6 so as to match the inversion threshold voltage of the inverter 4 at the next stage of the inverter 6, the power source voltages for the nMOS and pMOS of the inverter 6 are independently supplied. The invention is not limited to that amount, and only one power source voltage may be set, depending upon the desired circuit performance. The independent power source voltages are supplied only to the inverter 6 in the above embodiment. The invention is not limited thereto. For example, independent power source voltages may be supplied to the inverter 4. In the above embodiment, only positive power source voltages relative to the ground potential are used. A power source capable of generating both positive and negative voltages relative to the ground potential may be used with the similar advantageous effects under the conditions described above.

The independent power source terminals of this embodiment may be supplied with voltages from an external circuit or from a built-in constant voltage circuit. Second to fourth embodiments to be described hereinunder are provided with voltage raising means or voltage dropping means (rectifier elements such as diodes and transistors).

[Second Embodiment]

Figure 6:
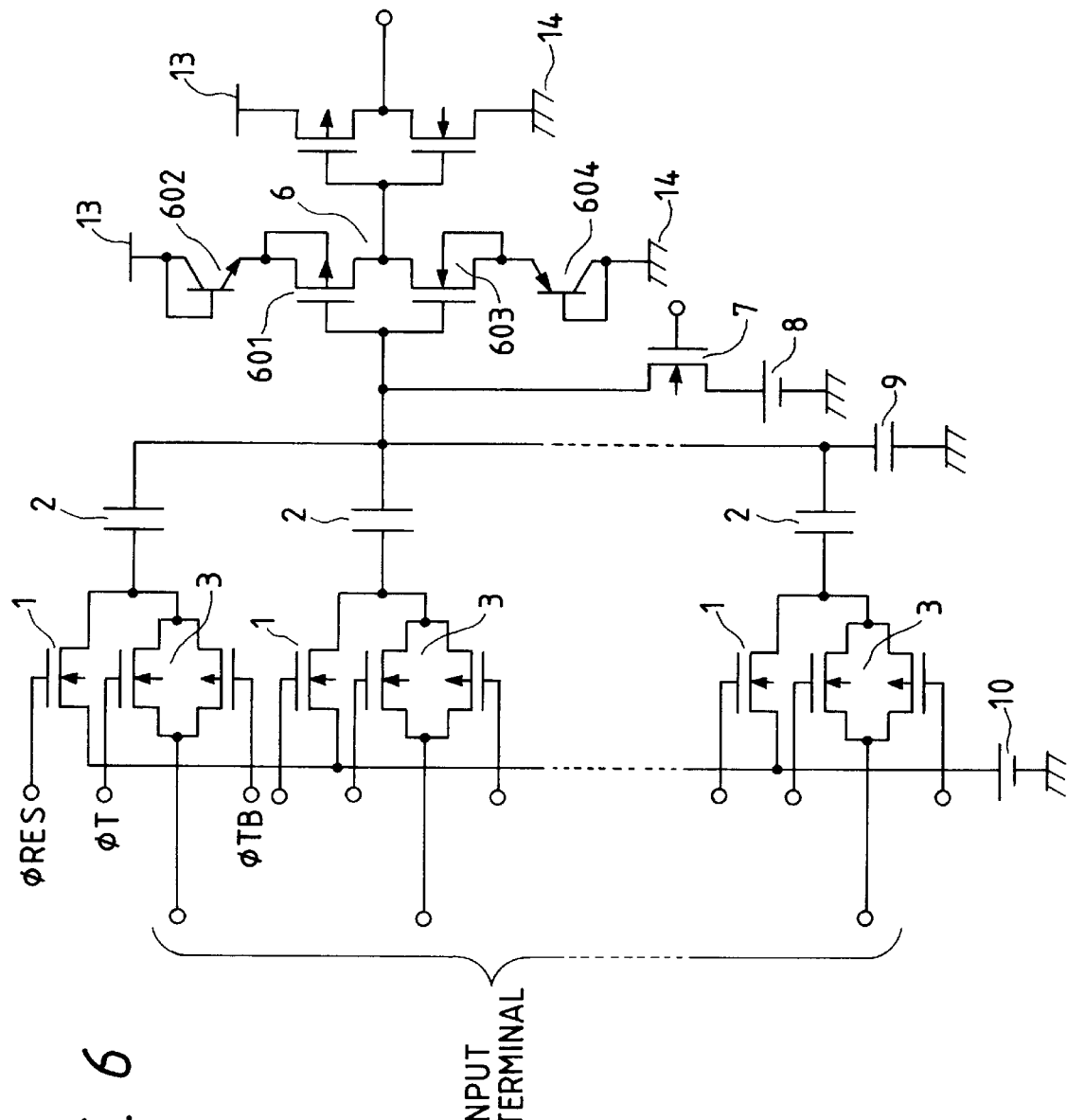
FIG. 6 is a circuit diagram showing the structure of a semiconductor device according to another embodiment of the invention.

FIG. 6 is a circuit diagram of a semiconductor device according to the second embodiment of the invention. In this embodiment, a voltage applied to transistors constituting an inverter is raised or lowered by transistors. In FIG. 6, reference numeral 601 represents a pMOS transistor, reference numeral 602 represents a p-type bipolar transistor, reference numeral 603 represents an nMOS transistor, and reference numeral 604 represents a p-type bipolar transistor. The transistors 601 to 604 constitute a first inverter 6. With this connection, the source and well terminals of the pMOS transistor 601 are supplied with the voltage applied to the power source terminal 13 lowered by a voltage drop across the base and emitter of the n-type bipolar transistor 602. Similarly, the source and well terminals of the nMOS transistor 603 are supplied with the voltage applied to the power source terminal 14 raised by a voltage drop across the base and emitter of the p-type bipolar transistor 604. Therefore, the inverter 6 substantially operates at the power source voltage lowered by the voltage drops across the bases and emitters of the n- and p-type bipolar transistors 602 and 604.

As different from the first embodiment, in the second embodiment, a single power source like those supplied to the well region of the first reset switch can be realized. Without providing external or internal independent power source voltages, advantageous effects similar to those of the first embodiment can be obtained.

This embodiment is not limited only to the above structure. For example, obviously, the same advantageous effects can be obtained by connecting a p-type bipolar transistor between the power source terminal 13 and the pMOS transistor 601 and an n-type bipolar transistor between the power source terminal 14 and the nMOS transistor 603, with the collectors and bases being short-circuited. Furthermore, the same advantageous effects from the view point of improving the operation range of the inverter 6 can be obtained by connecting a plurality of n-type bipolar transistors between the power source terminal 13 and the pMOS transistor 601 and a plurality of p-type bipolar transistors between the power source terminal 14 and the nMOS transistor 603, with the collectors and bases being short-circuited.

[Third Embodiment]

Figure 7:
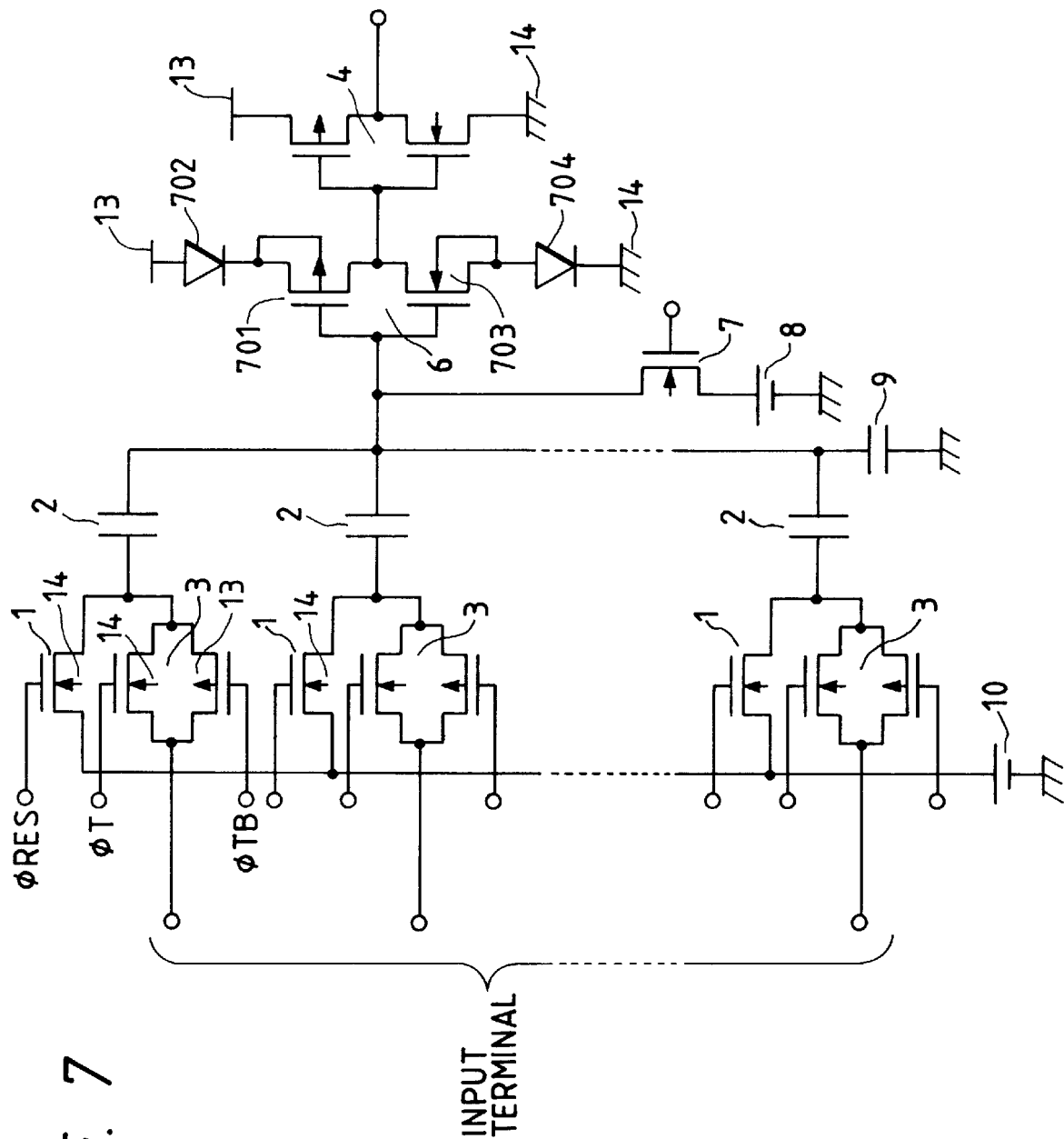
FIG. 7 is a circuit diagram showing the structure of a semiconductor device according to a further embodiment of the invention.

FIG. 7 is a circuit diagram of a semiconductor device according to the third embodiment of the invention. In this embodiment, a voltage applied to transistors constituting an inverter is raised or lowered by diodes. In FIG. 7, reference numeral 701 represents a pMOS transistor, reference numeral 702 represents a first diode element, reference numeral 703 represents an nMOS transistor, and reference numeral 704 represents a second diode element. The transistors and diode elements 701 to 704 constitute a first inverter 6. Connected to the power source terminal 13 are not only the first inverter 6 but also the well terminals of the second inverter 4 and signal transfer switch 3, and the like. With this connection, the source and well terminals of the pMOS transistor 701 are supplied with the voltage applied to the power source terminal 13 lowered by a voltage drop across the first diode element 702. Similarly, the source and well terminals of the nMOS transistor 703 are supplied with the voltage applied to the power source terminal 14 raised by a voltage drop across the second diode element 704. Therefore, the inverter 6 substantially operates at the power source voltage lowered by the voltage drops across the two diode elements 702 and 704.

In this embodiment, the first and second diode elements are used singularly. A plurality of diode elements may be used, with the similar advantageous effects from the view point of the operation range of the inverter 6. With the structure of this embodiment, the similar advantageous effects of the first embodiment can be obtained without providing inner or external independent power source voltages.

[Fourth Embodiment]

Figure 8:
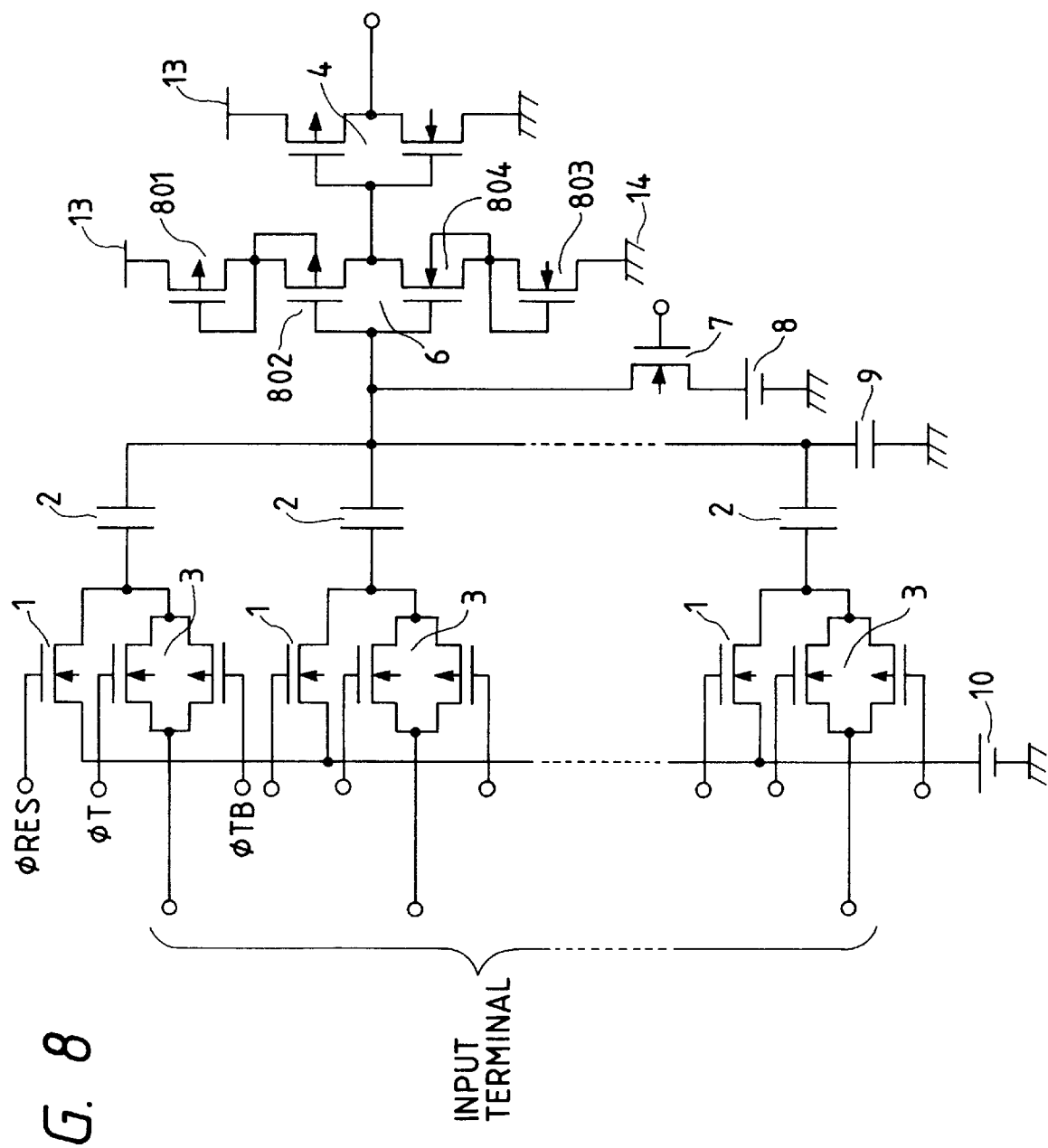
FIG. 8 is a circuit diagram showing the structure of a semiconductor device according to a still further embodiment of the invention.

FIG. 8 is a circuit diagram of a semiconductor device according to the fourth embodiment of the invention. In this embodiment, a voltage applied to transistors constituting an inverter is raised or lowered by MOS transistors. In FIG. 8, reference numeral 801 represents a first pMOS transistor, reference numeral 802 represents a second pMOS transistor, reference numeral 803 represents a first nMOS transistor, and reference numeral 804 represents a second nMOS transistor. The transistors 801 to 804 constitute a first inverter 6. Connected to the power source terminal 13 are the first inverter 6, the second inverter 4, and the like. With this connection, the source and well terminals of the second pMOS transistor 802 are supplied with the voltage applied to the power source terminal 13 lowered by a threshold voltage of the first pMOS transistor 801. Similarly, the source and well terminals of the nMOS transistor 704 are supplied with the voltage applied to the power source terminal 14 raised by a threshold voltage of the first nMOS transistor 803. Therefore, the inverter 6 substantially operates at the power source voltage lowered by the threshold voltages of the nMOS and pMOS transistors 801 and 803. The numbers of nMOS transistors 803 and pMOS transistors 801 are not limited to one, but a plurality of either or both types of transistors may be used, as will be apparent from the characteristics of the inverter 6.

With the structure of this embodiment, similar advantageous effects to those of the first embodiment can be obtained without providing inner or external independent power source voltages. Since additional elements are MOS transistors same as the inverters 4 and 6 and the reset switches 1 and 7, this configuration can be realized at a low cost without increasing the number of manufacture processes.

[Fifth Embodiment]

Figure 9:
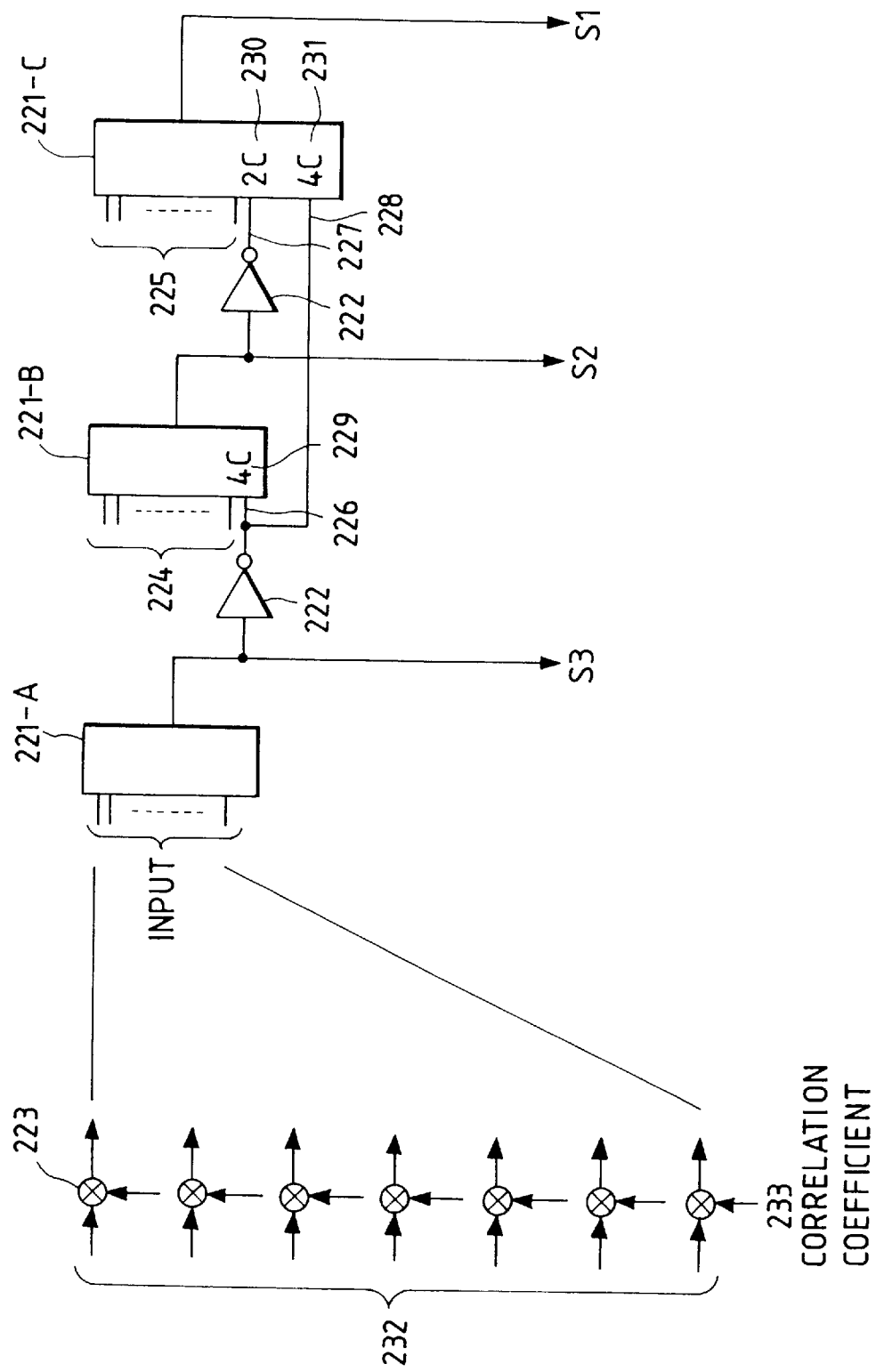
FIG. 9 is a block diagram showing the structure of a circuit using the semiconductor device according to an embodiment of the invention.

Next, the fifth embodiment will be described with reference to FIG. 9 wherein the semiconductor devices of the above embodiments are applied to a correlation calculation circuit. FIG. 9 is a block diagram of a majority decision arithmetic operation circuit constituted by three majority decision arithmetic operation circuit blocks 221-A, 221-B, and 221-C each having seven input terminals, corresponding to one of the first to fourth embodiments, and being constituted by the reset switch 1, capacitor 2, signal transfer switch 3, sense amplifier 5, first inverter 6, and the like. The majority decision arithmetic operation circuit block 221-A corresponds to that shown in FIG. 1, the block 221-B corresponds to that shown in FIG. 10, and the block 221-C corresponds to that shown in FIG. 11.

In FIG. 9, reference numeral 222 represents an inverter, reference numeral 223 represents a comparator for comparing a signal at an input terminal 223 with a correlation coefficient 233. Reference numerals 224 and 225 represent an input terminal group to which seven signals those input to the majority decision arithmetic operation circuit block 221-A are input. Reference numerals 226, 227, and 228 represent an input terminal to which an output signal from the preceding majority decision arithmetic circuit block is input. Reference numerals 229, 230, and 231 represent capacitance values 4C, 2C, and 4C connected to the input terminals 226, 227, and 228, where C is a capacitance value connected to a usual input terminal.

Figures 12, 13:
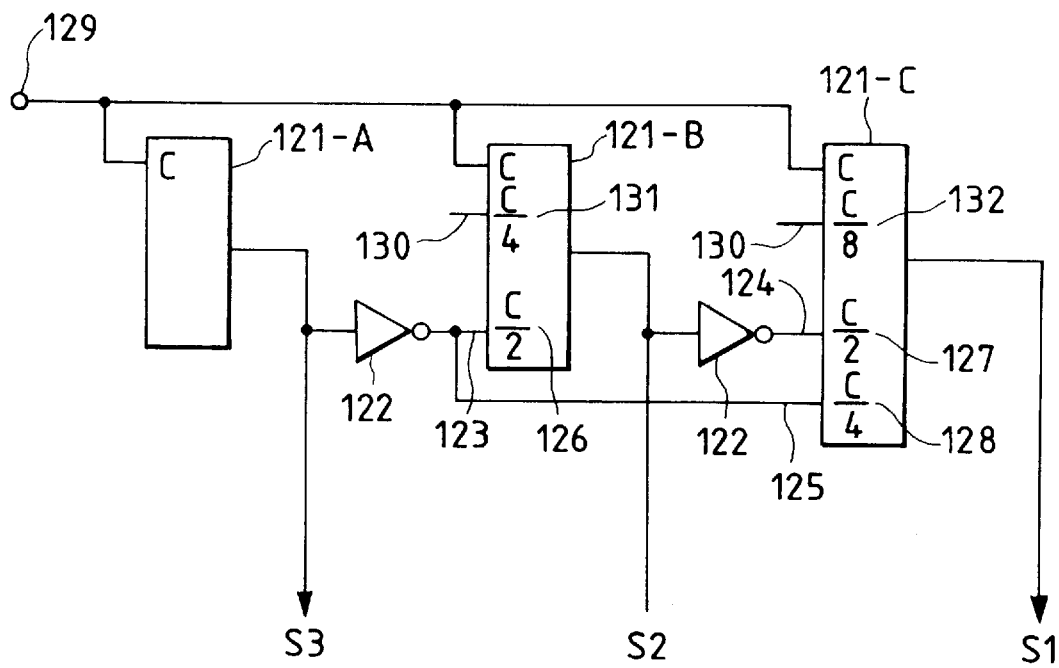
FIG. 12 is a table illustrating the operation of the embodiment shown in FIG. 9.
FIG. 13 is a block diagram showing the structure of a circuit using the semiconductor device according to an embodiment of the invention.

Referring to FIG. 9, an input signal and a corresponding correlation coefficient 233 are input to the comparator 223 which outputs a signal "H" if the input signal and correlation coefficient 233 coincide and a signal "L" if not. An output of the comparator is supplied to the majority decision arithmetic circuit blocks 221-A to 221-C. For example, as the outputs of the comparators 223 are supplied to the majority decision arithmetic circuit block 221-A having seven inputs, and if the number of signals "H" is larger than half of the total input signals, i.e., if four or more input signals among seven input signals are "H", the majority decision arithmetic circuit block 221-A outputs "H". The output state of the majority decision arithmetic circuit blocks 221-A to 221-C of seven inputs is shown in the table of FIG. 12.

Figure 10:
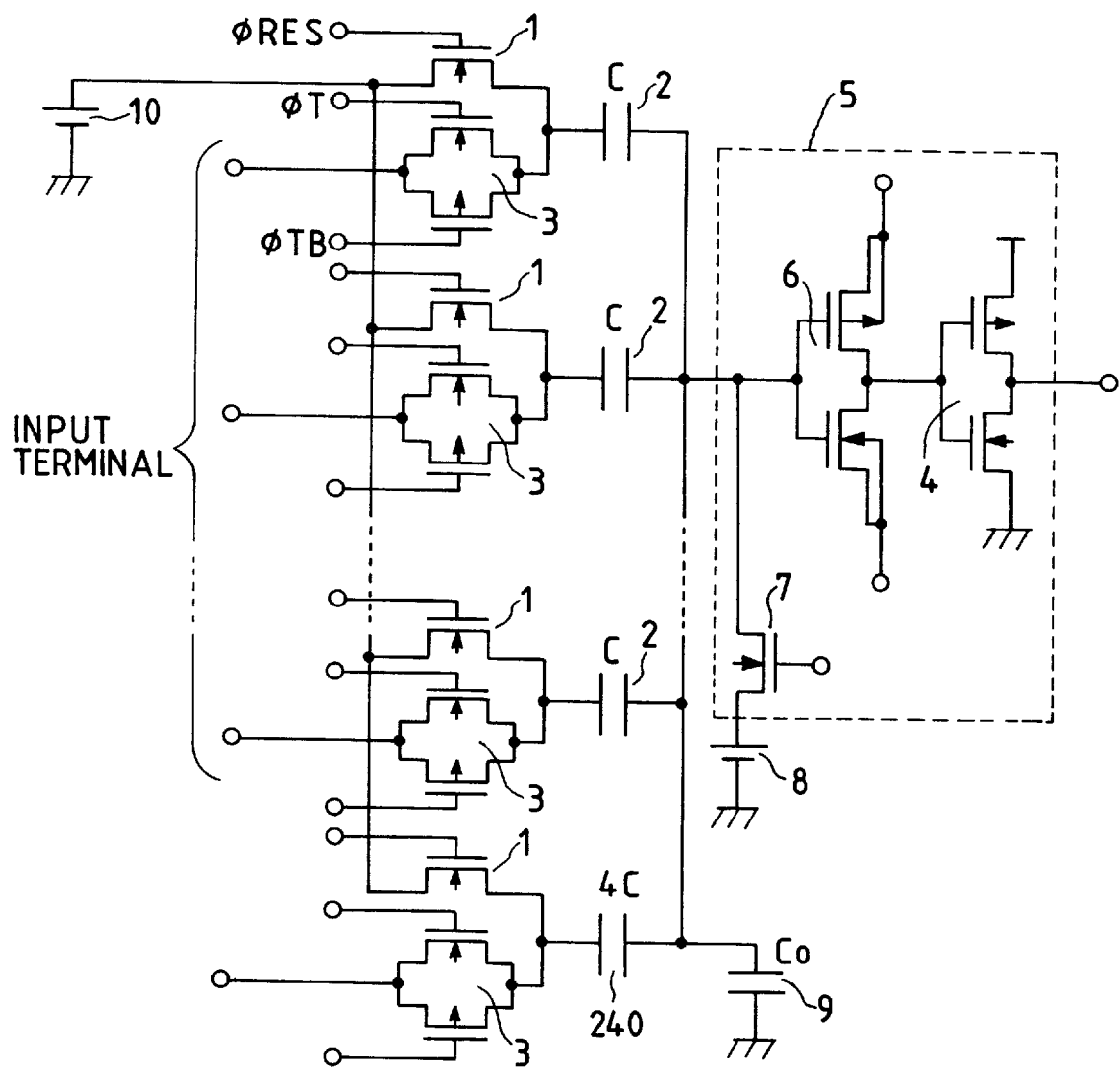
FIG. 10 is a circuit diagram showing the structure of a semiconductor device according to another embodiment of the invention.

The output of the majority decision arithmetic circuit block 221-A of seven inputs is inverted by the inverter 222 and applied to a weighting input terminal of the majority decision arithmetic circuit block 221-B. Specifically, as shown in FIG. 10, reference numeral 240 represents a capacitor generally four times as large as the capacitor 2 connected to each input path. This circuit shown in FIG. 10 corresponds to a majority decision arithmetic circuit block connected with eleven capacitors each having a capacitance C. Therefore, this circuit is a majority decision arithmetic circuit of eleven inputs whose weighting input terminal 226 is supplied with an output of the block 221-A and whose seven input terminals are supplied with the signals same as those input to the block 221-A. For example, if four or more signals among seven signals are "H", a signal "L" is applied to the weighting input terminal 226 as seen in the table shown in FIG. 12. If six or more signals among seven signals applied to the input terminals 224 other than the weighting input terminal 226 are "H", the majority decision arithmetic circuit of eleven inputs judges that the inputs as a whole is of a majority side, and outputs a signal "H". If four or five inputs among seven inputs are "H", it is not of a majority side so that the block outputs a signal "L".

If three or fewer inputs among seven inputs are "H", a signal "H" is applied to the weighting input terminal. If two or three inputs are "H", the total inputs "4+2 (4 corresponding to weighting)" or "4+3 (4 corresponding to weighting)" are six or larger so that it is judged to be of the majority side and the signal "H" is output. If one or no input is "H", the total inputs "4+0" or "4+1" are smaller than six, so that a signal "L" is output. The output state for each number of "H" signals of the majority decision arithmetic circuit block 221-B is shown in the table of FIG. 12 at S2.

Figure 11:
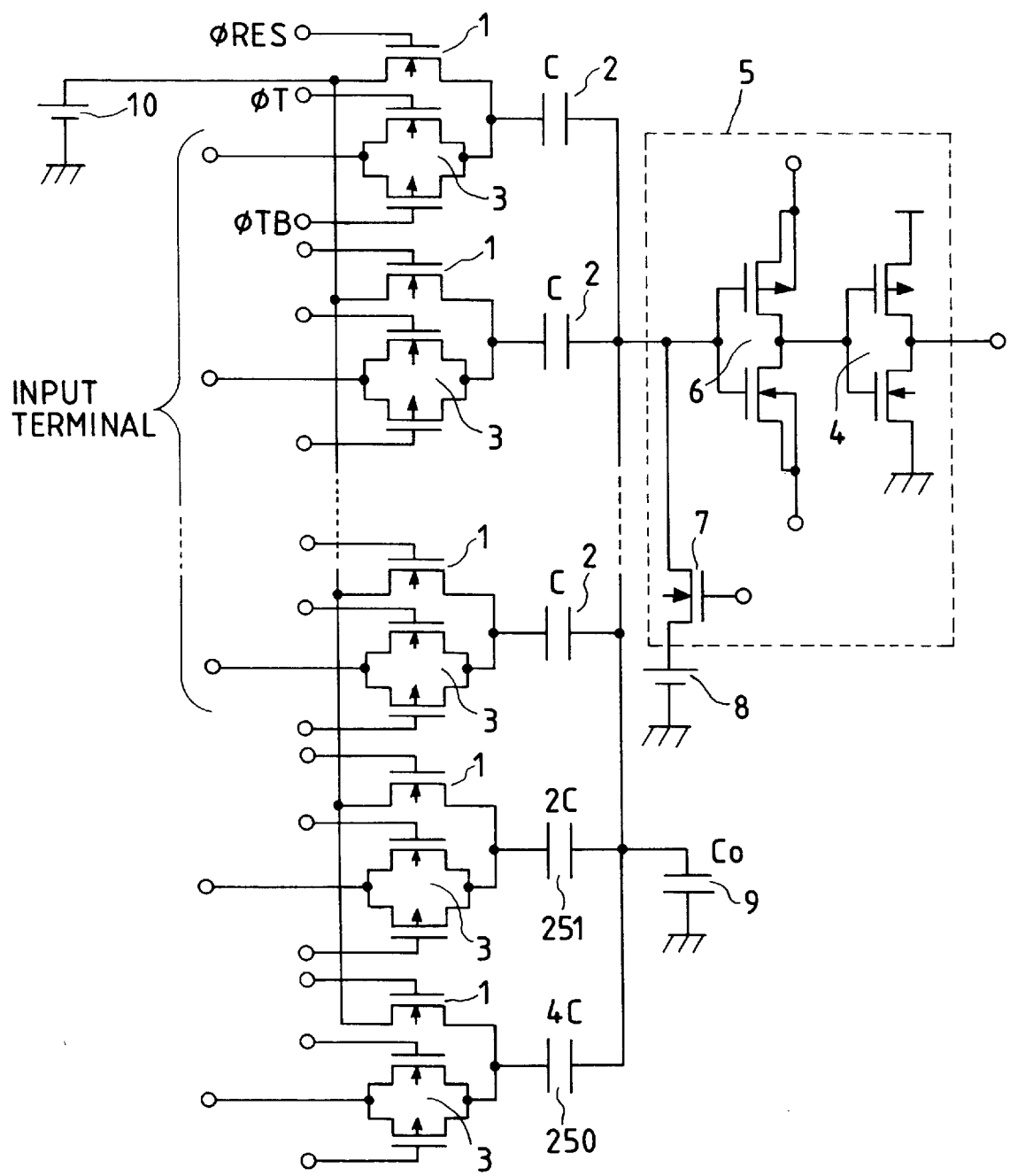
FIG. 11 is a circuit diagram showing the structure of a semiconductor device according to another embodiment of the invention.

Similarly, as shown in FIG. 11, the majority decision arithmetic circuit block 221-C has two weighting terminals 250 and 21 for a fourfold capacitance value and a twofold capacitance value. The sense amplifier 5 shown in FIG. 11 uses one of the inverters 6 of the first to fourth embodiments. As shown in FIG. 9, an output signal inverted by the inverter 222 of the majority decision arithmetic circuit block 221-A is applied to the 4C weighting input terminal 228, an output signal inverted by the inverter 222 of the majority decision arithmetic circuit block 221-B is applied to the 2C weighting input terminal 227, and the signals same as those input to the majority decision arithmetic circuit block 221-A are applied to the seven input terminals. The majority decision arithmetic circuit block 221-C therefore operates as having the total of thirteen inputs (=7+2+4) and outputs a signal shown in the table of FIG. 12 at S1.

With this circuit structure, the number of inputs coincident with the correlation coefficient can be output as a binary signal of three digits as shown in FIG. 12. The circuit structure of this invention realizes a correlation arithmetic operation circuit capable of reducing the circuit scale more than a conventional scale, allowing high speed arithmetic operation, and reducing consumption power.

[Sixth Embodiment]

The sixth embodiment of the invention will be described with reference to FIGS. 13 and 14. This embodiment of the invention realizes an analog-digital converter (hereinafter called an A/D converter) of 3-bit precision. In FIG. 13, reference numerals 121-A, 121-B, and 121-C represent arithmetic operation circuit blocks of one input, two inputs, and three inputs, the blocks using the semiconductor devices of the first to fourth embodiments. Reference numeral 122 represents inverters. Reference numerals 123, 124, and 125 represent an input terminal to which an output signal from the preceding arithmetic operation circuit block is input. Reference numerals 126, 127, and 128 represent capacitance values C/2, C/2, and C/4 connected to the input terminals 123, 124, and 125, where C is a capacitance value connected to a usual input terminal. Reference numeral 129 represents an input terminal, and reference numeral 130 represents a set input terminal, reference numerals 131 and 132 represent capacitance values of C/4 and C/8 connected to the set input terminals 130. S1, S2, and S3 are digital output signal terminals.

In this embodiment, it is assumed that a 5 V power source series is used. Referring to FIG. 13, of the arithmetic circuit blocks 121-A to 121-C, the arithmetic circuit block 121-A is reset to 0 V, and the arithmetic circuit blocks 121-B and 121-C are reset to about 2.5 V. The signal input terminals 123, 124, and 125 and set input terminals 130 on the input side of the input arithmetic calculation capacitor 2 are reset to 5 V. At this time, the analog signal input terminal 129 is 0 V. Next, the set input terminals 130 are set to 0 V and the input voltage at the input terminal 129 is gradually changed from 0 V forming an analog signal. As the analog input signal takes about 2.5 V or higher, the sense amplifier input voltage of the arithmetic circuit block 121-A exceeds the logical inversion voltage (assuming that it is 2.5 V) and a signal "H" is output. The results are shown in the table of FIG. 14 at S3.

Next, the operation of the arithmetic circuit block 121-B will be described. As the analog input signal changes to 2.5 V or higher, the input terminal 123 changes from the reset voltage of 5 V to a voltage of 0 V. A potential change at the sense amplifier input terminal of the arithmetic circuit block 121-B is given by the following equation:

$$\{C \times VA - (C/2) \times 5 - (C/4) \times 5\}/(C + C/2 + C/4)[V] \qquad (2)$$

As understood from this equation, the arithmetic circuit block 121-B outputs a signal "H" if the analog signal voltage VA is 3.75 V or higher, and a signal "L" if it is 2.5 V or higher and lower than 3.75 V. The results are shown in the table of FIG. 14 at S2.

Similarly, in the arithmetic circuit block 121-B, an inverted output of the arithmetic circuit block 121-A is supplied to the input terminal 128 and an inverted output of the arithmetic circuit block 121-B is supplied to the input terminal 127. The output state is shown in the table of FIG. 14 at S1.

In this embodiment, as shown in the table of FIG. 14, an A/D converter for converting an analog signal voltage into a digital signal of 3-bit can be realized with a very small circuit scale, while allowing high speed arithmetic operation and reduced consumption voltage.

In this embodiment, a 3-bit A/D converter is used. The invention is not limited thereto, and a multi-bit A/D converter may be realized easily.

Although a flash type A/D converter using capacitors is used in this embodiment, the invention is not limited thereto. For example, the invention is applicable to an encoder of the A/D converter with the similar advantageous effects, in which a signal input to a resistor train is compared with a standard signal by a comparator, and the result is encoded by the encoder circuit.

As described above, in a circuit block in which one ends of capacitors corresponding multiple-input terminals are connected in common to the input terminal of a sense amplifier, the total capacitance of the capacitors is an odd multiple of C which is the minimum capacitance.

For example, in the case of a correlation arithmetic operation circuit, each block without a control input terminal has capacitors all having the minimum capacitance. For example, in the fourth embodiment shown in FIG. 9, the capacitances connected to the control input terminal have even values of 2C and 4C so that the total capacitance with the odd number of input signal terminals is an odd multiple of C. With this configuration, a signal can be precisely discriminated from a desired standard value, improving an arithmetic operation precision.

In the above description, the correlation arithmetic operation circuit is used. In the case of a binary D/A converter, assuming that the capacitance for an LSB signal is C, 2C is used for the first next bit, and 4C is used for the second next bit, in a twofold way. The total capacitance for the multiple-input terminals is therefore an odd multiple of C so that a high precision D/A converter can be realized.

Also in the case of an A/D converter, as described with the sixth embodiment shown in FIG. 13, the division number set for discrimination of an analog signal level between larger than a half of the full range and smaller than the half, is one 1C for the arithmetic circuit block 121-A, the division number set for discrimination between ¼, 2/4, and ¾ is three for the arithmetic circuit block 121-B, the total capacitance being an odd multiple (sevenfold=1+2+4) of the minimum capacitance of C/4. For the arithmetic circuit block 121-C, C/4, C/2, and C as twofold values of the minimum capacitance of C/8 are used and set to an odd multiple of fourteenfold=2+4+8.

The correlation arithmetic operation unit, D/A converter, and A/D converter have been described in the above by way of example. The invention is not limited thereto, but is applicable to a variety type of logic circuits such as digital-analog converter circuits, adders, and subtraters, with similar advantageous effects.

A D/A converter of binary digital-analog conversion can be realized in a twofold way, such as 2C, 4C, and 8C for the upper bits. In this case, the common connection terminal of one ends of capacitors is connected to a MOS source follower amplifier.

[Seventh Embodiment]

Figure 15:
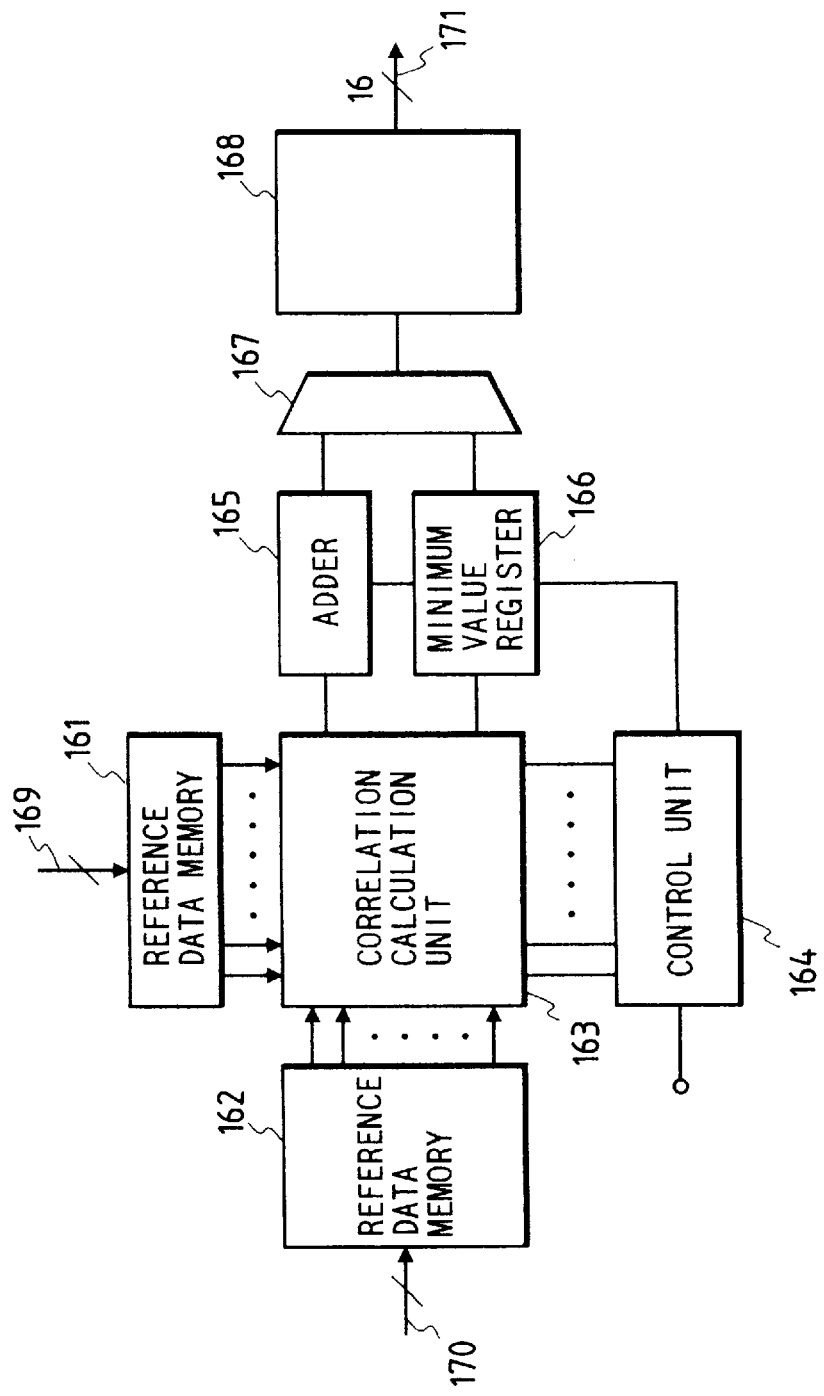
FIG. 15 is a block diagram showing the structure of a circuit using the semiconductor device according to another embodiment of the invention.

The seventh embodiment is shown in the block diagram of FIG. 15. In the seventh embodiment, the technology of the invention is used in combination with conventional circuit technologies to realize a motion detection chip for detecting a moving image or the like. In FIG. 15, reference numerals 161 and 162 represent memories for storing standard data and reference data. Reference numeral 163 represents a correlation calculation unit, reference numeral 164 represents a control unit for controlling the chip, reference numeral 165 represents an adder for adding the correlation results by the correlation calculation unit 163, reference numeral 166 represents a minimum value register for storing a minimum value of addition results by the adder 165, reference numeral 167 represents a comparison storage unit having a comparator for storing the address of the minimum value, reference numeral 168 represents an output buffer and an output result storage unit. A standard data train is input to an input bus 169, and a reference data train to be compared with the standard data train is input to an input bus 170. The memories 161 and 162 are, for example, SRAMs made of usual CMOS circuits.

The data read from the reference data memory 162 and standard data memory 161 is supplied to the correlation calculation unit of this invention. This correlation calculation unit 163 performs high speed parallel processes, is made of a small number of elements, realizing a small chip size and low cost. The adder 165 scores (evaluates) the correlation calculation. The comparison storage unit 167 compares the present correlation calculation result with the past maximum correlation calculation result (minimum addition value) stored in the register 166. If the present correlation calculation result is smaller than the minimum value, the present result is stored in the register 166 as a new minimum value, whereas if the past minimum value is smaller, this value is maintained in the register 166. With the above operations, the maximum correlation calculation result is always stored in the register 166. After the whole of the data train is calculated, the final results are output via the output buffer and output result storage unit 168 to an output bus 171, for example, in the form of 16-bit signal.

The control unit 164, adder 165, register 166, comparison storage unit 167, and output result storage unit 168 are made of usual CMOSs in the above embodiment. These units, particularly, the adder 165 or the like, may be made of the semiconductor device of the invention having a resetting means with multiple-input terminals, first inverter, sense amplifier, and the like. In this case, synchronous parallel addition, reliable operation of the sense amplifier, and high speed processes can be realized. As described so far, not only high speed and low cost, but also high inversion sensitivity of the input inverter of the sense amplifier can be attained, and further since calculations are executed by using mainly capacitors, consumption current can be reduced and low power chips can be realized. This chip is therefore suitable for portable equipments such as 8 mm VTR cameras. The embodiment is not limited only to image recognition, but is applicable to automatic translation through voice recognition, discrimination between speakers, and the like.

[Eighth Embodiment]

The eighth embodiment of the invention will be described with reference to FIGS. 16A to 16C. The eighth embodiment uses the technology of the invention in combination with technology of optical sensors (solid image pickup elements) and realizes a chip capable of performing high speed image processing before reading image data.

Figure 16A:
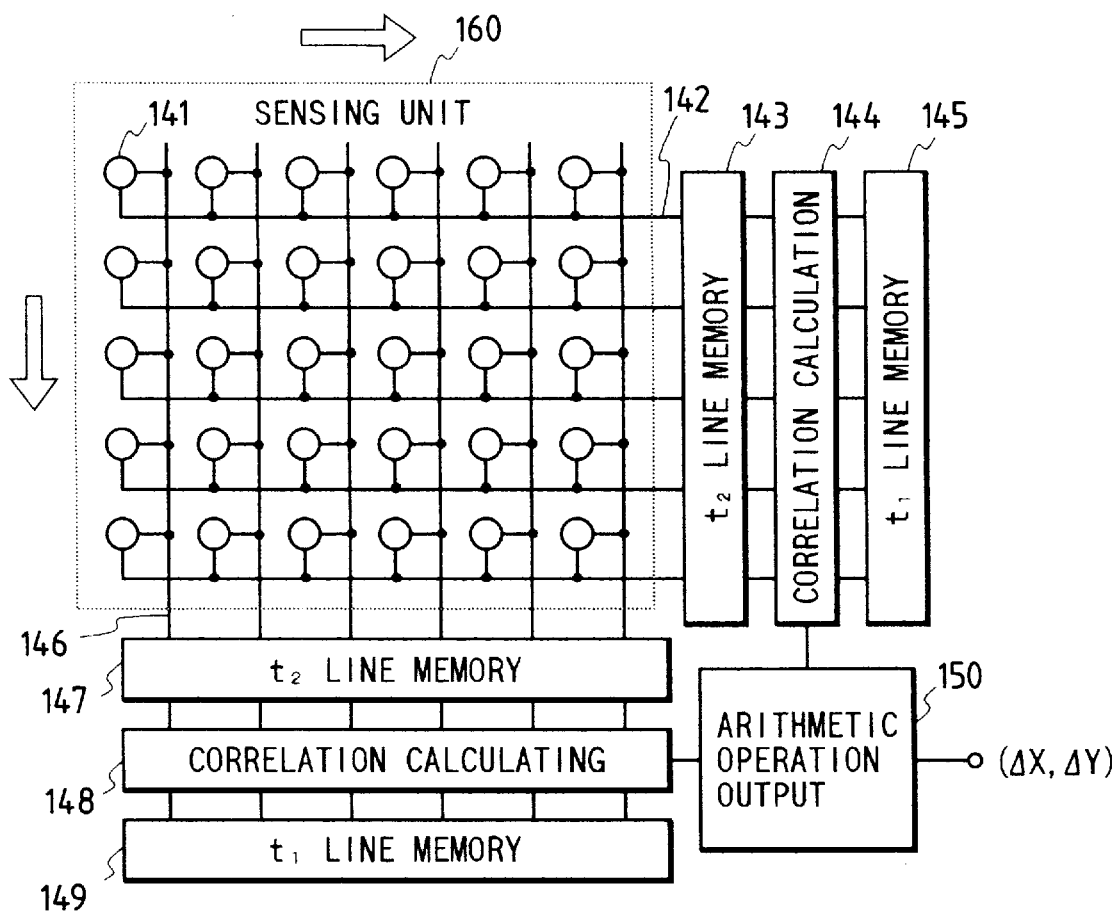
FIGS. 16A to 16C illustrate another embodiment of the invention in which another circuit using the semiconductor device is realized.
Figure 16B:
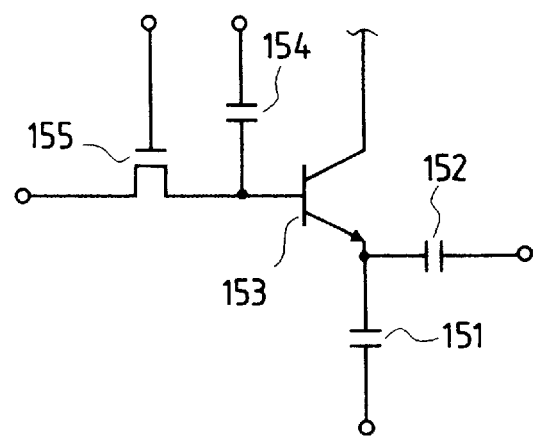
Figure 16C:
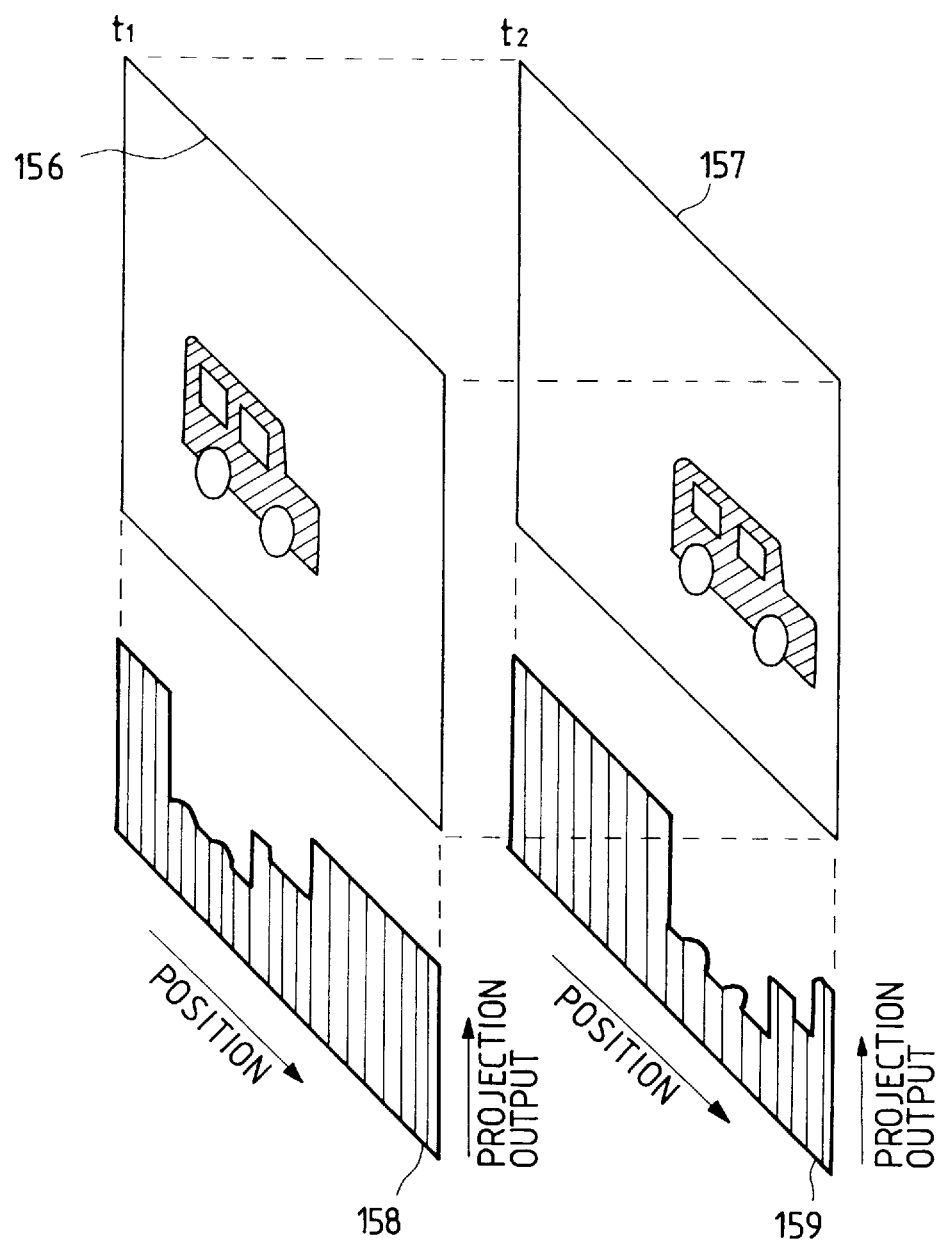

FIG. 16A is a block diagram showing the overall structure of a chip of this embodiment, FIG. 16B is a circuit diagram showing the chip pixel unit of the embodiment, and FIG. 16C illustrates the arithmetic operation by the chip of the embodiment.

In FIG. 16A, reference numeral 141 represents a photosensor including photoelectric conversion elements, reference numerals 143, 145, 147, and 149 represent line memories, reference numerals 144 and 148 represent correlation calculation units, and reference numeral 150 represents an arithmetic operation output unit. Of the photosensor 141 shown in FIG. 16B, reference numerals 151 and 152 represent coupling capacitor means for coupling to the output bus lines at the optical signal output terminals 142 and 146, reference numeral 153 represents a bipolar transistor, reference numeral 154 represents capacitor means connected to the base of the bipolar transistor 153, and reference numeral 155 represents an MOS transistor switch. Image incident to an image data sensing unit 160 is photoelectrically converted at the base region of the bipolar transistor 153.

An output corresponding to photoelectrically converted carriers is output from the emitter of the bipolar transistor 153 so that via the coupling capacitor means 151 and 152, the potentials at the output bus lines 142 and 146 rise in accordance with the input and accumulated charge signals. With the above operations, the addition results of pixels in the vertical direction are read by the line memory 147, and the addition results of pixels in the horizontal direction are read by the line memory 143. If a desired image area of the sensing unit 160 is selected by a decoder or the like (not shown), the addition results in the X- and Y-directions can be output which raise the base potential of the bipolar transistor 153 via the capacitor 154.

For example, as shown in FIG. 16C, consider the case wherein an image indicated at 156 is input at time t1 and an image indicated at 157 is input at time t2. In this case, the addition results in the Y-direction are image signals representative of a motion of a vehicle as indicated at 158 and 159. These image signals are stored in the line memories 147 and 149 shown in FIG. 16A. Similarly, also in the X-direction, the image signals are stored in the line memories 143 and 145.

As seen from the data output train of the image signals indicated at 158 and 159 shown in FIG. 16C, these image signals shift in correspondence with a motion of an image. This shift amount in the Y-direction is calculated by the correlation calculation unit 144, and the shift in the X-direction is calculated by the correlation calculation unit 144. In this manner, a motion of an object in the two-dimensional plane can be detected easily.

The correlation calculation circuit of the invention is applicable to the correlation calculation units 144 and 148 shown in FIG. 16A. Since the number of elements is smaller than the conventional circuit, elements can be disposed easily at a sensor pixel pitch. Although the correlation calculation is executed relative to a sensor analog signal, if an A/D converter is provided between the line memory and the output bus line, obviously the digital signal correlation calculation can be executed.

As a sensor element, a bipolar transistor is used in this embodiment. Obviously an MOS type transistor may be used, or a photosensor without an amplifying transistor may be used.

In this embodiment, the correlation calculation is executed relative to data trains at different times. If projection output results in the X- and Y-directions of a plurality of pattern data sets are stored in a different memory, pattern recognition can be performed.

As described above, the following advantageous effects can be obtained by a combination of an image pickup element and the correlation calculation circuit of the invention.

(1) Since the data read serially from a conventional sensor is not processed but data read parallel at the same time is processed in parallel. Therefore, a motion detection process and a pattern recognition process can be performed at high speed.

(2) A one-chip semiconductor device including a sensor can be fabricated and the image processing can be performed without increasing the number of peripheral circuit elements. Therefore, the high performance products are possible, including a controller for controlling to direct a TV screen toward a user, a controller for directing the cooler wind toward a user, a controller for tracking an image for a 8 mm VTR camera, a label recognizing apparatus used for factories, a robot for automatic recognition of a person, a controller for controlling a distance between vehicles, and the like.

A combination with an image sensor has been described above. Obviously, the embodiment is effective not only for a motion detection of image data or a pattern recognition but also for voice recognition or the like.

As described so far, according to the present invention, the semiconductor device having one ends of capacitor means connected via switching means to multiple-input terminals, the other ends of the capacitor means being connected in common to an input terminal of a sense amplifier, comprises first power source means for supplying a power to the switching means, and second power source means for supplying a power to the sense amplifier, wherein the first and second power source means are independent and separate. Accordingly, in configuring a circuit and system for performing a parallel arithmetic operation process, the circuit scale can be reduced, an arithmetic operation speed can be made high, an arithmetic operation precision can be improved, and a consumption power can be reduced.

Further, in order to allow the semiconductor device to share the power source voltage, a pn junction circuit is added to a first inverter constituting the sense amplifier. The highest sensitivity region of the inverter is used as an operation region. Accordingly, a high sensitivity sense amplifier can be realized, contributing to speeding up an arithmetic operation speed and improving an arithmetic operation precision.

Still further, the semiconductor device is applicable to a correlation calculation circuit, a D/A converter, an A/D converter, a signal processing system, or the like. Accordingly, the circuit scale can be reduced, an arithmetic operation speed can be made high, an arithmetic operation precision can be improved, and a consumption power can be reduced.

What is claimed is:

1. A semiconductor device provided with a plurality of capacitors of which one end is connected via a plurality of switches to multiple-input terminals, and of which the other end is connected in common to an input terminal of a sense amplifier, comprising:

first power source means for supplying power to well terminals of said switches; and second power source means for supplying power to well terminals and source terminals of an inverter of the sense amplifier, wherein said first and second power source means are independent, and supply the well terminals of said switches, and the well terminals and source terminal of the inverter of said sense amplifier, with different voltages.

2. A semiconductor circuit device comprising:

a plurality of semiconductor devices as recited in claim 1, wherein an output or an inverted output of the first semiconductor device of the plurality of semiconductor devices is input to the second semiconductor device.

3. A semiconductor circuit device comprising:

an A/D converter including the semiconductor device as recited in claim 1, wherein an analog signal is input to the semiconductor device and a digital signal corresponding to the analog signal is output.

4. A semiconductor circuit device comprising:

a D/A converter including the semiconductor device as recited in claim 1, wherein a digital signal is input to the semiconductor device and an analog signal corresponding to the digital signal is output.

5. A semiconductor circuit device wherein a correlation calculation is executed by using the semiconductor circuit device as recited in claim 2.

6. A signal processing system comprising a semiconductor circuit device as recited in claim 5, 3, or 4.

7. A signal processing system according to claim 6, further comprising an image signal input device for inputting an image signal.

8. A signal processing system according to claim 6, further comprising a storage unit for storing data.

9. A semiconductor device according to claim 1, wherein the total capacitance of said capacitors connected in common is generally an odd multiple of a minimum capacitance C among said capacitors connected to said multiple-input terminals.

10. A semiconductor device provided with a plurality of capacitors of which one end is connected via a plurality of switches to multiple-input terminals, and of which the other end is connected in common to an input terminal of a sense amplifier, wherein:

said sense amplifier includes an inverter, and voltage raising or lowering means is serially connected between said inverter and power source means for supplying power to said inverter, well terminals of said switches and different well terminal and source terminal of said inverter with different voltages.

11. A semiconductor circuit device comprising:

a D/A converter including the semiconductor device as recited in claim 10, wherein an analog signal is input to the semiconductor device and a digital signal corresponding to the analog signal is output.

12. A semiconductor circuit device comprising:

a D/A converter including the semiconductor device as recited in claim 10, wherein a digital signal is input to the semiconductor device and an analog signal corresponding to the digital signal is output.

13. A signal processing system comprising a semiconductor circuit device as recited in claim 11 or 12.

14. A signal processing system according to claim 13, further comprising an image signal input device for inputting an image signal.

15. A signal processing system according to claim 13, further comprising a storage unit for storing data.

16. A semiconductor circuit device comprising:

a plurality of semiconductor devices as recited in claim 10, wherein an output or an inverted output of the first semiconductor device of the plurality of semiconductor devices is input to the second semiconductor device.

17. A semiconductor device according to claim 10, wherein the total capacitance of said capacitors connected in common is generally an odd multiple of a minimum capacitance C among said capacitors connected to said multiple-input terminals.

18. A semiconductor device provided with a plurality of capacitors of which one end is connected via a plurality of switches to multiple-input terminals, and of which the other end is connected in common to an input terminal of a sense amplifier, wherein:

said sense amplifier includes an inverter, and at least one or more rectifying elements are serially connected between said inverter and power source means for supplying power to said inverter, thereby providing well terminals of said switches and a well terminal and a source terminal of said inverter with different voltages.

19. A semiconductor circuit device comprising:

an A/D converter including the semiconductor device as recited in claim 18, wherein an analog signal is input to the semiconductor device and a digital signal corresponding to the analog signal is output.

20. A semiconductor circuit device comprising:

a D/A converter including the semiconductor device as recited in claim 18, wherein a digital signal is input to the semiconductor device and an analog signal corresponding to the digital signal is output.

21. A signal processing system comprising a semiconductor circuit device as recited in claim 19 or 20.

22. A signal processing system according to claim 21, further comprising an image signal input device for inputting an image signal.

23. A signal processing system according to claim 21, further comprising a storage unit for storing data.

24. A semiconductor circuit device comprising:

a plurality of semiconductor devices as recited in claim 18, wherein an output or an inverted output of the first semiconductor device of the plurality of semiconductor devices is input to the second semiconductor device.

25. A semiconductor device according to claim 18, wherein the total capacitance of said capacitors connected in common is generally an odd multiple of a minimum capacitance C among said capacitors connected to said multiple-input terminals.

26. A semiconductor device provided with a plurality of capacitors of which one end is connected via a plurality of switches to multiple-input terminals, and of which the other end is connected in common to an input terminal of a sense amplifier, wherein:

said sense amplifier includes an inverter, and at least one or more transistors are serially connected between said inverter and power source moans for supplying power to said inverter, thereby providing well terminals of said switches and a well terminal and a source terminal of said inverter with different voltages.

27. A semiconductor circuit device comprising:

an A/D converter including the semiconductor device as recited in claim 26, wherein an analog signal is input to the semiconductor device and a digital signal corresponding to the analog signal is output.

28. A semiconductor circuit device comprising:

a D/A converter including the semiconductor device as recited in claim 26, wherein a digital signal is input to the semiconductor device and an analog signal corresponding to the digital signal is output.

29. A signal processing system comprising a semiconductor circuit device as recited in claim 27 or 28.

30. A signal processing system according to claim 29, further comprising an image signal input device for inputting an image signal.

31. A signal processing system according to claim 29, further comprising a storage unit for storing data.

32. A semiconductor circuit device comprising:

a plurality of semiconductor devices as recited in claim 26, wherein an output or an inverted output of the first semiconductor device of the plurality of semiconductor devices is input to the second semiconductor device.

33. A semiconductor device according to claim 26, wherein the total capacitance of said capacitors connected in common is generally an odd multiple of a minimum capacitance C among said capacitors connected to said multiple-input terminals.

* * * * *

UNITED STATES PATENT AND TRADEMARK OFFICE
CERTIFICATE OF CORRECTION

PATENT NO. : 5,847,669
DATED : December 8, 1998
INVENTOR(S) : TETSUNOBU KOCHI

It is certified that error appears in the above-indentified patent and that said Letters Patent is hereby corrected as shown below:

DRAWING SHEETS, SHEET 4

Replace Sheet 4 of 16 (Figure 5) with attached amended Figure 5.

DRAWING SHEETS, SHEET 16

Figure 17:
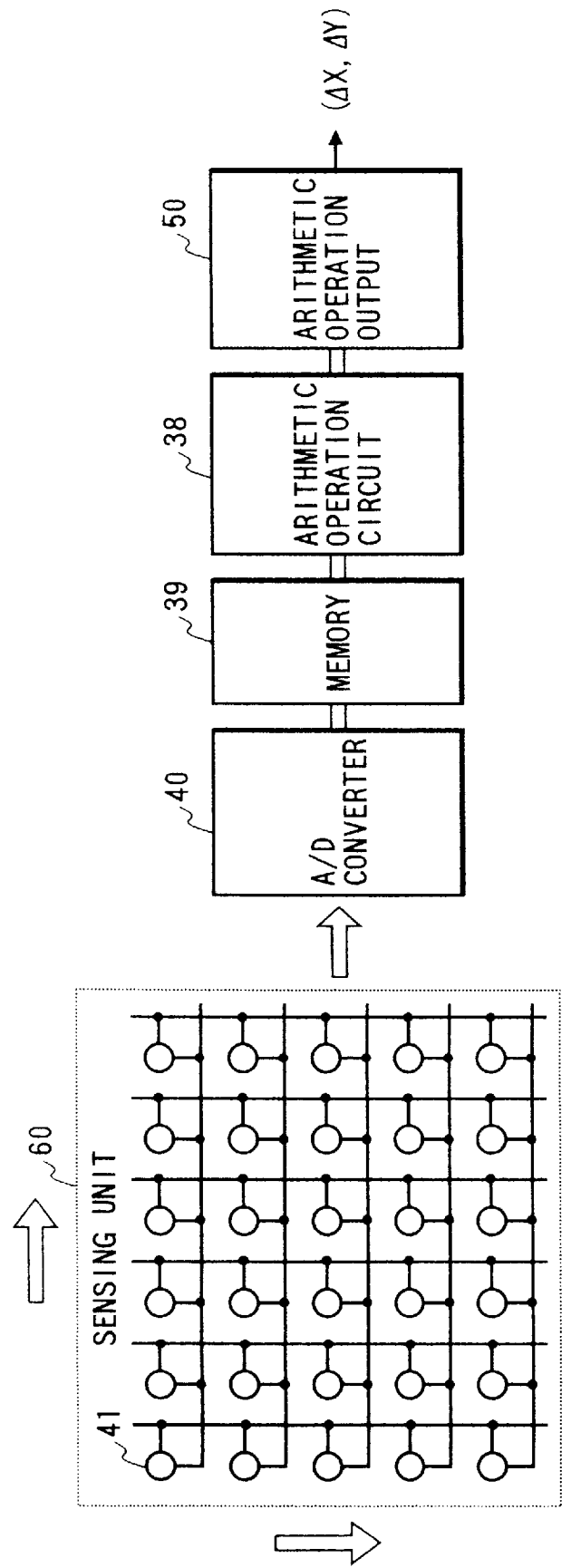
FIG. 17 is a block diagram showing the structure of a circuit using a conventional semiconductor device.
Figure 17:
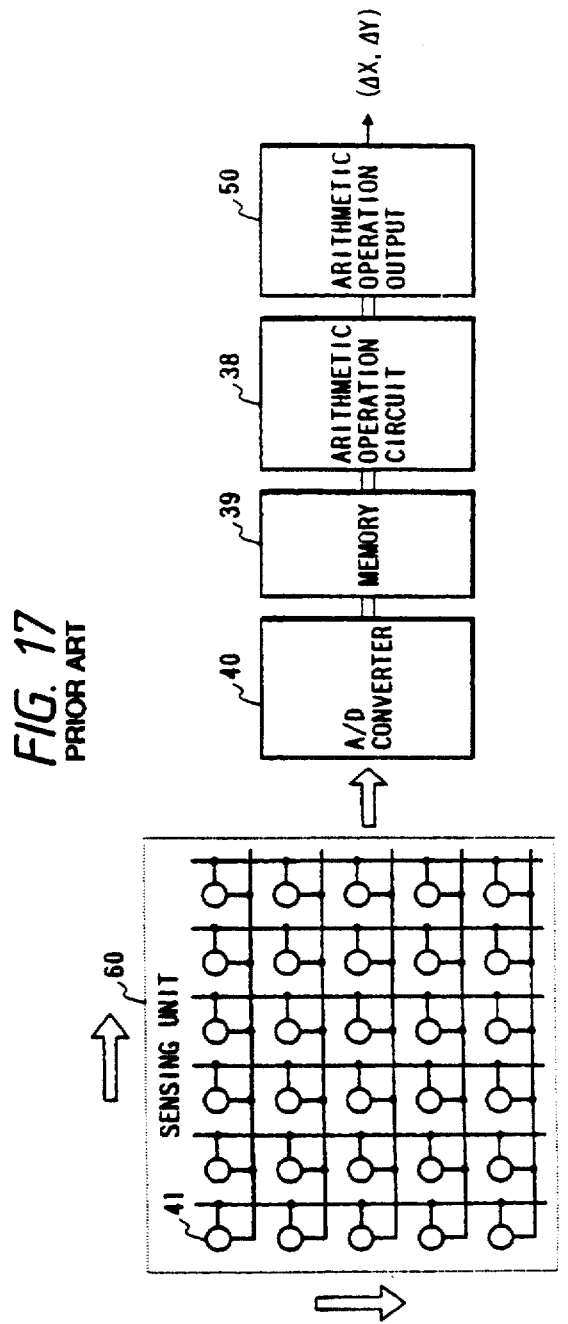
Figure 5:
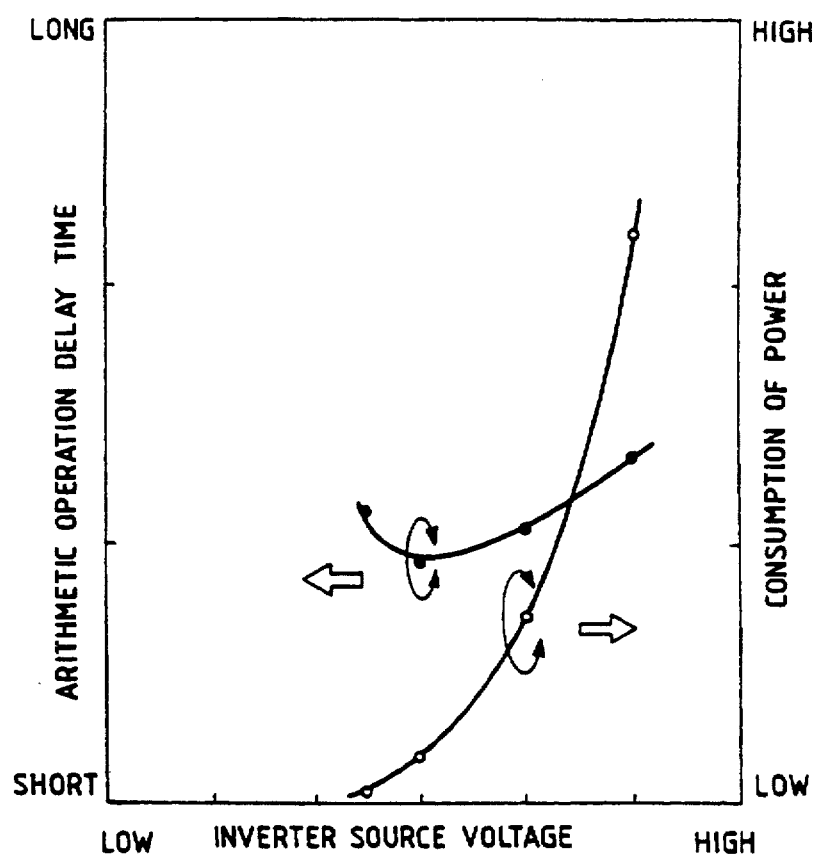

Replace Sheet 16 of 16 (Figure 17) with attached amended Figure 17.

COLUMN 1

Line 33, "large" should read --larger--.
Line 37, "in the" should read --of--.
Line 38, "of wiring" should read --in the wiring--.
Line 52, "real time" should read --real-time--.
Line 55, "geometrical" should read --geometric--.

COLUMN 2

Line 46, "power" should read --of power--.

UNITED STATES PATENT AND TRADEMARK OFFICE
CERTIFICATE OF CORRECTION

PATENT NO. : 5,847,669
DATED : December 8, 1998
INVENTOR(S) : TETSUNOBU KOCHI

It is certified that error appears in the above-indentified patent and that said Letters Patent is hereby corrected as shown below:

COLUMN 3

Line 37, "capacitors 2" should read --capacitor 2--.

COLUMN 4

Line 40, "power" should read --of power--.
   Line 56, "power." should read --of power.--.

COLUMN 5

Line 3, "amount," should read --arrangement,--.
   Line 55, "view point" should read --viewpoint--.

COLUMN 6

Line 21, "view" should read --view- --.
   Line 43, "transistor 704" should read --transistor 804--.
   Line 59, "manufacture" should read --manufacturing--.

UNITED STATES PATENT AND TRADEMARK OFFICE
CERTIFICATE OF CORRECTION

PATENT NO. : 5,847,669
DATED : December 8, 1998
INVENTOR(S) : TETSUNOBU KOCHI

It is certified that error appears in the above-indentified patent and that said Letters Patent is hereby corrected as shown below:

COLUMN 7

Line 12, "those" should read --like those--.
Line 20, "an" should read --a--.
Line 57, "side" should read --side,--.

COLUMN 8

Line 3, "21" should read --251--.

COLUMN 9

Line 29, "corresponding" should read --corresponding to--.
Line 66, "subtraters," should read --subtracters,--.

COLUMN 10

Line 61, "equipments" should read --equipment--.

COLUMN 11

Line 53, "144." should read --148.--.

UNITED STATES PATENT AND TRADEMARK OFFICE
CERTIFICATE OF CORRECTION

PATENT NO. : 5,847,669
DATED : December 8, 1998
INVENTOR(S) : TETSUNOBU KOCHI

It is certified that error appears in the above-indentified patent and that said Letters Patent is hereby corrected as shown below:

COLUMN 12

Line 43, "power" should read --of power--.
Line 58, "power" should read --of power--.

COLUMN 13

Line 31, "claim 5, 3, or 4." should read --claim 3, 4, or 5--.
Line 54, "a D/A" should read --and A/D--.

UNITED STATES PATENT AND TRADEMARK OFFICE
CERTIFICATE OF CORRECTION

PATENT NO. : 5,847,669
DATED : December 8, 1998
INVENTOR(S) : TETSUNOBU KOCHI

It is certified that error appears in the above-indentified patent and that said Letters Patent is hereby corrected as shown below:

COLUMN 15

Line 1, "moans" should read --means--.

Signed and Sealed this

Twenty-sixth Day of October, 1999

Attest:

*Attesting Officer*

Q. TODD DICKINSON

*Acting Commissioner of Patents and Trademarks*